United States Patent
Hong et al.

(10) Patent No.: US 7,335,317 B2
(45) Date of Patent: Feb. 26, 2008

(54) METHOD OF PREPARING POLYMER COMPOSITE USING UNIDIRECTIONALLY SOLIDIFIED GIANT MAGNETOSTRICTIVE MATERIAL

(75) Inventors: Soon Hyung Hong, Daejeon (KR); Oh Yeoul Kwon, Daejeon (KR); Won Je Park, Kwangju (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 399 days.

(21) Appl. No.: 11/189,034

(22) Filed: Jul. 26, 2005

(65) Prior Publication Data

US 2006/0017039 A1    Jan. 26, 2006

Related U.S. Application Data

(63) Continuation of application No. 10/487,278, filed on Feb. 20, 2004, now abandoned.

(30) Foreign Application Priority Data

Oct. 12, 2001    (KR) ...................... 10-2001-0063086

(51) Int. Cl.
*H01F 1/00*    (2006.01)
(52) U.S. Cl. ............................... 252/62.54; 252/62.55; 335/215; 428/539.5; 428/312.2; 428/312.8; 428/900; 428/928

(58) Field of Classification Search ............. 252/62.54, 252/62.55; 335/215; 428/539.5, 312.2, 428/312.8, 900, 913
See application file for complete search history.

(56) References Cited

U.S. PATENT DOCUMENTS 5,792,284 A    8/1998    Cedell et al.
6,149,736 A *  11/2000   Sukigara et al. ............ 148/301

FOREIGN PATENT DOCUMENTS

EP    0 312 063 A1    4/1989
JP    1-272744         10/1999

\* cited by examiner

*Primary Examiner*—C. Melissa Koslow
(74) *Attorney, Agent, or Firm*—Sterne, Kessler, Goldstein & Fox P.L.L.C.

(57) ABSTRACT

The present invention relates to methods of preparing a polymer composite using a giant magnetostrictive material, and more particularly, to polymers composite having various improved properties, in which the advantageous structure of the giant magnetostrictive material produced by unidirectional solidification can be maintained by removing the eutectic phase from the magnetostrictive material and filling resulting voids with a polymer resin.

24 Claims, 5 Drawing Sheets

(a) Laves phase, RE phase (b) Void (c) Polymer resin

METHOD OF PREPARING POLYMER COMPOSITE USING UNIDIRECTIONALLY SOLIDIFIED GIANT MAGNETOSTRICTIVE MATERIAL

CROSS REFERENCE TO RELATED APPLICATIONS

This application is a continuation-in-part of U.S. patent application Ser. No. 10/487,278, entitled METHOD OF PREPARING POLYMER COMPOSITE USING UNIDIRECTIONALLY SOLIDIFIED GIANT MAGNETOSTRICTIVE MATERIAL, now abandoned, which is a 35 U.S.C. 371 National Phase of International Application No. PCT/KR02/01724, filed Sep. 13, 2002, which in turn claims priority to Korean Patent Application No. 2001-0063086, filed Oct. 12, 2001, which are all incorporated herein by reference in their entirety.

BACKGROUND OF THE INVENTION

1. Field of the Invention

The present invention relates to methods of preparing a polymer composite using a giant magnetostrictive material, and more particularly, to polymer composites having various improved properties, in which the advantageous structure of the giant magnetostrictive material produced by unidirectional solidification can be maintained by removing the eutectic phase from the magnetostrictive material and filling resulting voids with a polymer resin.

2. Background Art

In general, the term "magnetostriction" refers to a Joule effect, where a material changes length in response to a change in magnetic field, and to its inverse effect, a Villari effect, where a magnetization state in the material changes in response to an external mechanical strain. Compared to PZT (lead zirconium tantanate) piezoceramic materials and nickel-based magnetostrictive materials conventionally used as transducers or actuators, rare earth element (RE)-transition metal magnetostrictive materials are higher in magnetostrictive strain, and have superior energy efficiency. Thus, the RE-transition metal magnetostrictive materials are superior for various applications, and, particularly, for aeronautics, communications, oil refining, automobiles, MEMS (Micro Electro Mechanical Systems) and medicine. More specifically, such materials are used for high output actuators, linear and rotary motors, control of noise and vibration, pumps, fuel injection, robotics, position determination, surveillance activities, valve actuators, micro-positioning, sonar, audio systems, ultrasonic instruments, force sensing, endurance measurement, etc.

The RE-transition metal magnetostrictive material, which is prepared by means of a unidirectional solidification, normally exists in the form of a single crystal or aligned poly-grains. In order to obtain high magnetostrictive strain in such an alloy, grains in the alloy must be arranged in a specific direction. This is because upon unidirectional alignment of the grains, the magnetostrictive strain increases, and internal loss generated at a grain boundary decreases. Such orientation in the magnetostrictive material is important for obtaining high magnetostrictive strains at low magnetic field.

A typical RE-transition metal magnetostrictive material having aligned grains is an alloy comprising $Tb_{0.3}Dy_{0.7}Fe_{1.9}$. However, this alloy has the disadvantages of short span life and difficult processing, due to high brittleness of a Laves phase ($REFe_2$ phase, in which "RE" refers to a complete solid solution of Tb and Dy). To solve these problems, larger amounts of terbium (Tb) and dysprosium (Dy) are added, or the iron (Fe) content is decreased, in order to form a larger amount of the eutectic phase having superior ductility and toughness at boundaries of the Laves phase. As such, the eutectic phase comprises a densely formed network structure throughout the material.

As the phase diagram of FIG. 4 shows, the eutectic phase comprises RE phase and $REFe_2$ phase in a finely mixed state. When the total composition is very close to $REFe_2$, only a small amount of the eutectic phase is formed. In this case, the $REFe_2$ phase of the eutectic structure, which forms at the eutectic temperature, crystallizes at the nearby existing primary $REFe_2$, and only the RE phase is formed between large $REFe_2$ primary dendrites. This type of eutectic solidification is called "divorced eutectic solidification." However, if the total composition is closer to the exact eutectic composition, a larger amount of the eutectic phase is formed in a regular type of finely mixed state.

The major disadvantage of the unidirectionally solidified RE-transition metal magnetostrictive material is its low electric resistance, attributable to the metal. Thus, since heat generation and energy loss are high due to eddy currents at high frequencies, the use of these materials is limited in applications requiring high frequencies. Hence, a method of reducing the eddy current loss is used that cuts the material into thin sheets (about 1 mm thickness) and layers them with an insulator in-between. However, such a layering process is difficult and expensive to perform, because the RE-transition metal magnetostrictive material has high magnetostrictive strain due to the maximized volume fraction of the intermetallic compound, and is therefore very brittle.

As an alternative, powders of the RE-transition metal magnetostrictive material are mixed with the polymer resin and prepared as a polymer composite, which is advantageous due to a simple preparation process, low cost and easy compaction to various shapes. However, since small grains having magnetostrictive property are dispersed in a non-magnetic polymer resin, such a composite is disadvantageous in light of inferior crystal orientation and low magnetization strength and thus much lower magnetostrictive strain, compared to the unidirectionally solidified material. Even so, more important advantages of the composite material are its good mechanical toughness and high electric resistance, due to the polymer matrix functioning as an electrical insulator. By increasing the electric resistance, heat generation due to eddy current is decreased, and the usable frequency range is increased from several tens of kHz to several hundreds of kHz. In the case of preparing the composite material with $Tb_xDy_{1-x}Fe_{2-w}$, the total eddy current energy loss decreases to ⅙ compared to energy loss in unidirectionally solidified material. In addition, the composite material has higher toughness under tensile stress.

Conventionally, the polymer composite material is prepared as follows.

(1) The unidirectionally solidified RE-Fe magnetostrictive material ingot is pulverized in an inert gas atmosphere to make grains, so as to inhibit oxidation behavior thereof;

(2) The particles are mixed with a polymer binder and pores present in the grains are removed by evacuating;

(3) A mixture of the resin and the grains is compacted under pressure, while an external magnetic field of 100 Oe or more is applied perpendicularly relative to a pressure axis to the grains for their unidirectional alignment upon compacting. In this case, the external magnetic field is applied using an RE-cobalt (e.g., NdFeB) permanent magnet or a solenoid coil, whereby the grains forms a texture aligned in a magnetic field direction; and (4) The polymer resin is cured to produce the composite having excellent mechanical properties.

At present, the polymer composite material is considerably lower in magnetostrictive strain than the unidirectionally solidified material. This is because the grains of the magnetostrictive material are very small and require a larger magnetic field upon application, due to the formation of the demagnetizing field in a reverse direction of the magnetic field to be applied, and also have poor crystal orientation. Fine grains are low in magnetostrictive strain because saturation magnetization strength of the surface is lower than saturation magnetization strength in the bulk. As the distance between grains increases, a coupling force between them is decreased. In particular, as in RE-iron magnetostrictive material, it is very important that the texture is maintained in the favorable crystal orientation, i.e., having a large magnetostriction.

The RE-transition metal magnetostrictive material can be further increased in its magnetic properties through annealing. As for the RE-iron magnetostrictive material, the annealing process is performed at a temperature higher than 887° C., the eutectic temperature (see FIG. 4). In some cases, a magnetic field may be applied during annealing. Although the magnetostrictive strain increases by alleviating the stress remaining upon solidification through the annealing, heat treatment effects are not great. Also, in the latter case, the stress transferring effects are drastically reduced due to the removal of the eutectic phase, thus the material exhibits low toughness.

BRIEF SUMMARY OF THE INVENTION

Therefore, it is an object of the present invention to address the problems of the conventional art and to provide a method of preparing an aligned polymer composite exhibiting good properties in high frequency ranges due to increased electric resistance and having high fracture resistance due to improved toughness of the material, as well as improved magnetostrictive properties, while maintaining a unidirectionally aligned texture of a unidirectionally solidified magnetostrictive material.

There is provided a method of preparing a polymer composite, the method including (a) reaction annealing a unidirectionally solidified giant magnetostrictive material to remove a eutectic phase and create a rare earth metal phase with voids; (b) infiltrating a polymer resin into the voids; and (c) curing the polymer resin. The reaction annealing can be performed at a temperature higher than the eutectic temperature using oxides in a furnace to remove a liquid rare earth phase from the magnetostrictive material. The reaction annealing can be performed in a furnace at a temperature higher than the eutectic temperature and using a reaction promoter (oxides such as quartz granule mainly composed of $SiO_2$) to remove the liquid rare earth phase from the magnetostrictive material. The reaction promoter includes quartz granules. The giant magnetostrictive material includes a rare earth-iron magnetostrictive alloy. The rare earth-iron magnetostrictive alloy can include, for example, $Tb_xDy_{1-x}Fe_{2-w}$ ($0.27 \leq x \leq 0.35$, $0 \leq w \leq 1.30$); $Tb_xHo_{1-x}Fe_{2-w}$ ($0.10 \leq x \leq 1.00$, $0 \leq w \leq 1.30$); $Sm_xDy_{1-x}Fe_{2-w}$ ($0.80 \leq x \leq 1.00$, $0 \leq w \leq 1.30$); $Sm_xHo_{1-x}Fe_{2-w}$ ($0.60 \leq x \leq 1.00$, $0 \leq w \leq 1.30$); $Tb_xHo_yDy_zFe_{2-w}$ ($0.10 \leq x \leq 1.00$, $0 \leq y \leq 0.9$, $0 \leq z \leq 0.8$, $0 \leq w \leq 1.30$, $x+y+z=1$); and $Sm_xHo_yDy_zFe_{2-w}$ ($0.60 \leq x \leq 1.00$, $0 \leq y \leq 0.4$, $0 \leq z \leq 0.4$, $0 \leq w \leq 1.30$, $x+y+z=1$).

The reaction annealing can be performed at about 1000° C. for approximately 3 hours. Before the infiltrating, gases present in the magnetostrictive material can be removed under an inert gas and a vacuum. Pressure can be applied to infiltrate the polymer resin into pores of reaction annealed sample. The polymer resin can be, but not limited to, epoxy resin, phenol resin, polyimide, polystyrene, or combinations thereof. The curing can be performed by heating the polymer resin at about 80° C. for approximately 3 hours. The polymer composite includes a rare earth metal phase, and wherein the polymer resin has a lower Young's modulus than the rare earth metal phase. The unidirectionally solidified giant magnetostrictive material may include at least 5% by volume of eutectic phase by way of controlling Fe contents. The infiltrated resin can be a YD-114 epoxy resin.

In another aspect, the invention is directed to a polymer composite that can be prepared by the method described above.

In another aspect, the invention is directed to a polymer composite that includes a dendrite phase of unidirectionally solidified giant magnetostrictive material, and a polymer resin in voids between the dendrites of the unidirectionally solidified giant magnetostrictive material.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED FIGURES

The accompanying drawings, which are included to provide a further understanding of the exemplary embodiments of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the embodiments of the present invention, examples of which are illustrated in the accompanying drawings.

Figure 1:
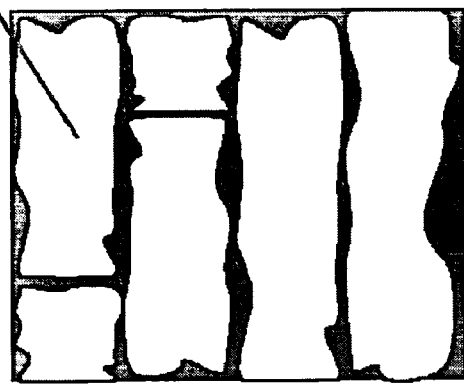
FIG. 1A shows a schematic structure of a unidirectionally solidified giant magnetostrictive material, as a unidirectionally aligned composite including Laves phase (or $REFe_2$ phase) exhibiting magnetic properties and a eutectic phase functioning to increase mechanical properties.
FIG. 1B shows a void-formed preform structure after removal of the eutectic phase from the structure shown in FIG. 1A by reaction annealing.
FIG. 1C shows a structure of the composite after infiltration of a polymer resin.
Figure 1:
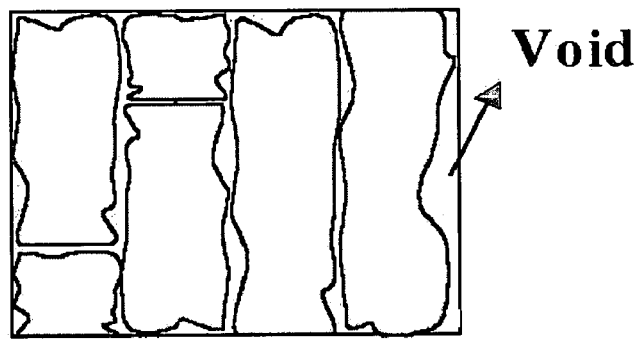
Figure 1:
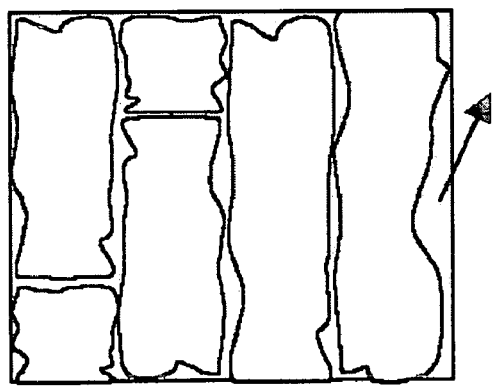

The present invention provides a method of preparing a polymer composite using a giant magnetostrictive material with a RE phase. One embodiment includes removing the RE phase from a unidirectionally solidified giant magnetostrictive material shown in FIG. 1A and FIG. 1B, infiltrating a polymer resin into an RE phase-removed void, followed by curing the infiltrated resin (see FIG. 1C).

The polymer composite of the present invention is excellent in magnetostriction because a Laves phase including a texture formed by unidirectional solidification is maintained in its original state, compared to conventional polymer composites containing the Laves phase of a powder form.

In the giant magnetostrictive material usable in the present invention, a phase showing a giant magnetostriction phenomenon is contained, together with the RE phase. As the phase showing magnetostriction, a rare earth-iron magnetostrictive material having grains aligned by unidirectional solidification can be used, with excellent resulting properties. Further, the iron element constituting the Laves phase may be alloyed with small amounts of other metals, for example, aluminum, manganese, cobalt and so on. In this regard, the rare earth-iron magnetostrictive material is exemplified by $Tb_xDy_{1-x}Fe_{2-w}$ ($0.20 \leq x \leq 1.00$, $0 \leq w \leq 1.30$), $Tb_xHo_{1-x}Fe_{2-w}$ ($0.10 \leq x \leq 1.00$, $0 \leq w \leq 1.30$), $Sm_xDy_{1-x}Fe_{2-w}$ ($0.80 \leq x \leq 1.00$, $0 \leq w \leq 1.30$), $Sm_xHo_{1-x}Fe_{2-w}$ ($0.60 \leq x \leq 1.00$, $0 \leq w \leq 1.30$), $Tb_xHo_yDy_zFe_{2-w}$ ($0.10 \leq x \leq 1.00$, $0 \leq y \leq 0.9$, $0 \leq z \leq 0.8$, $0 \leq w \leq 1.30$, x+y+z=1), $Sm_xHo_yDy_zFe_{2-w}$ ($0.60 \leq x \leq 1.00$, $0 \leq y \leq 0.4$, $0 \leq z \leq 0.4$, $0 \leq w \leq 1.30$, x+y+z=1), etc. For example, $Tb_xDy_{1-x}Fe_{2-w}$ ($0.27 \leq x \leq 0.35$) can be used in light of its excellent magnetostrictive characteristics, such as $Tb_{0.3}Dy_{0.7}Fe_{1.9}$ (also known as "terfenol-D").

The giant magnetostrictive material having grains aligned by unidirectional solidification can be obtained by known methods (e.g., Bridgman method, float zone melting, Czochralski method, etc.), which are apparent to those skilled in the art.

The eutectic phase is distributed between the primary $REFe_2$ phases forming a network structure, the amount of which can be controlled by controlling the total composition of a giant magnetostrictive material. Removal of the eutectic structure can be achieved by treating the magnetostrictive material containing liquid phase RE at a temperature higher than the eutectic temperature using a reaction furnace (or a reaction promoter therein). That is, since the liquid phase molten metal having an excessive amount of rare earth element has high reaction affinity to oxygen, the reaction promoter (e.g., oxides such as quartz granules) is used to easily remove the liquid phase molten metal from the magnetostrictive material.

The reaction annealing process at a temperature higher than the eutectic temperature melts the eutectic structure containing the RE phase, causing it to flow out. At the same time, magnetic properties of the Laves phase are further increased by the reaction annealing. That is, the removal of the eutectic phase of non-magnetic properties results in increasing (or reinforcing) magnetization, as well as in the magnetic domain being easily rotatable in a direction of the magnetic field. The molten eutectic structure flows out of the material due to a high reaction affinity with oxides (e.g., quartz granule). Since the Laves phase may become more coarse during heat treatment, but the unidirectionally aligned dendrite structure can be maintained as it is, the annealing process is very advantageous. The RE elements constituting the giant magnetostrictive material generally have a high tendency to oxidize, and thus the annealing process can be performed under inert gas or vacuum atmosphere.

Figure 2A:
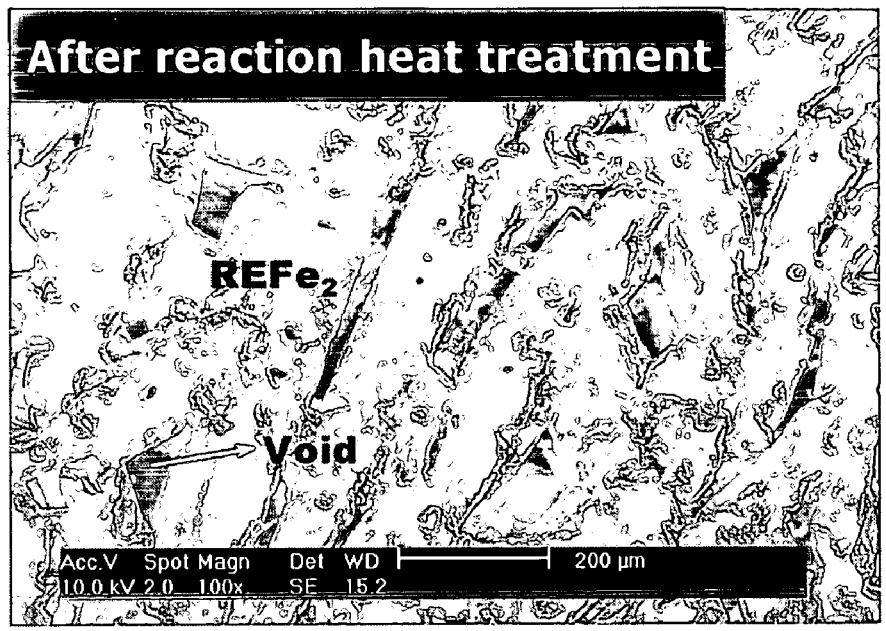
FIG. 2A is an electron microscopic photograph showing the material having only an $REFe_2$ phase after removal of the eutectic phase by reaction annealing.
Figure 2B:
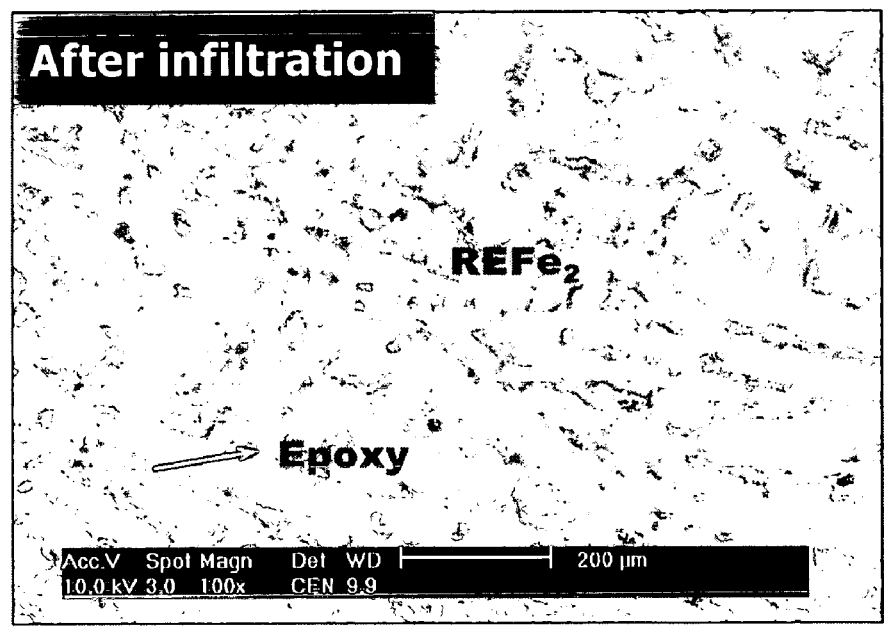
FIG. 2B is a photograph showing a structure of a cross-section polished of the polymer composite, observed by an electron microscope.

In FIG. 2A, it can be seen that the giant magnetostrictive material represented by $Tb_xDy_{1-x}Fe_{2-w}$ is reaction annealed to remove the excess liquid phase RE therefrom, such that only $REFe_2$ dendrite phase showing magnetic properties remains in the material structure. After the polymer resin is infiltrated to the material structure, the surface is polished. The polished structure is shown in FIG. 2B. From this figure, it can be seen that the $REFe_2$ phase is maintained as the aligned dendrite structure obtained from casting, while the RE or eutectic phase portion is replaced with the polymer resin.

The process of delivering the polymer resin into the eutectic phase-removed void in the structure of the magnetostrictive material is carried out by any known method, for example, infiltration. The polymer resin introduced into the material structure by infiltration is formed in a densely connected network structure in the material, thereby preventing propagation of cracks or absorbing fracture energy, thus providing high fracture resistance. In order to completely fill the polymer resin into fine channels in the material, all gases present in the material should preferably be removed under vacuum before the infiltration process begins.

The polymer resin applied to the infiltration process should preferably be a non-conducting, to increase electric resistance. To obtain excellent wetting properties between the polymer and the metal matrix, and complete infiltration through fine channels, a polymer resin having low viscosity can be used. The polymer resin may be suitably selected according to the properties required by those skilled in the art and is not specifically limited. Therefore, various polymer resins having different properties can be applied and the giant magnetostrictive material combining various properties of polymers can be realized.

The polymer resin meeting the above requirements includes thermosetting resins or thermoplastic resins, which are exemplified by epoxy resin, phenol resin, polyimide, polystyrene, etc. These resins are lower in Young's modulus than the rare earth metal phase. Thus, the replacement of the RE phase with polymer resin leads to a further increase in magnetostrictive strain, because the elongation of $REFe_2$ phase is less constrained by polymers than by RE.

Figure 3A:
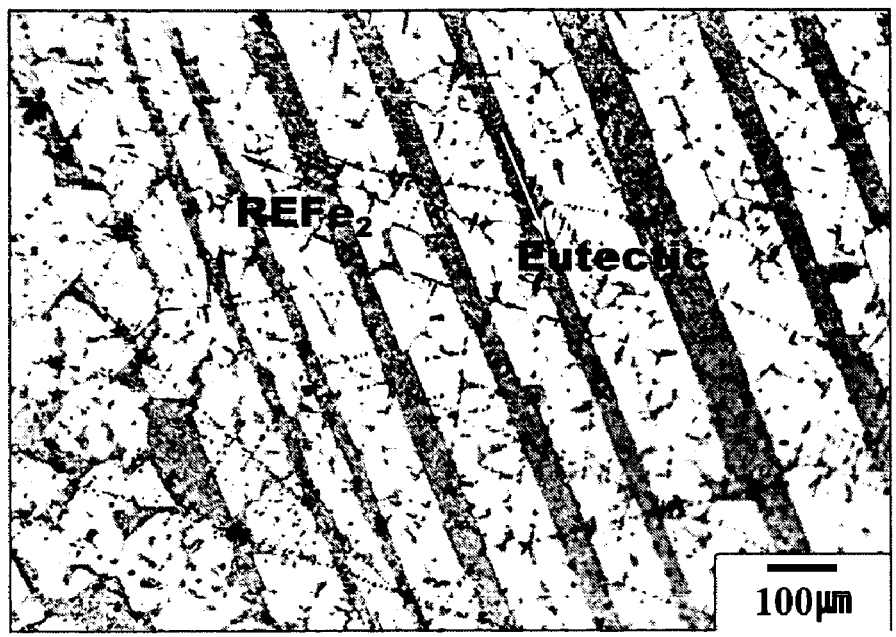
FIG. 3A is an electron micrograph showing the structure of a unidirectionally solidified terphenol-D containing 65 vol % of a $REFe_2$ phase, observed by an optical microscope.
Figure 3B:
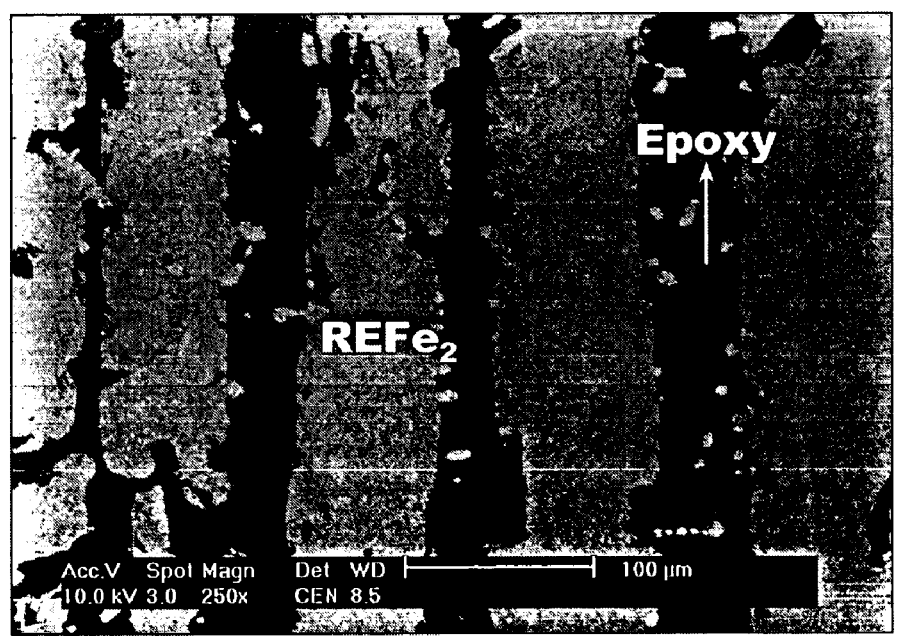
FIG. 3B is an electron micrograph showing the structure of a polymer composite made from the material shown in FIG. 3A.

FIG. 3A shows a structure of a cross-section of a unidirectionally solidified material, including 65 vol % of primary $REFe_2$ phase and 35 vol % of eutectic phase. FIG. 3B shows a structure of a cross-section of the polymer composite obtained by annealing the material shown in FIG. 3A at 1000° C. for 3 hours to remove the eutectic phase, and infiltrating the epoxy resin heated to 80° C. into the eutectic phase-removed voids, followed by curing the infiltrated resin.

The curing process of the infiltrated resin can be carried out by generally known methods. For example, in case of YD-114 epoxy resin [Kukdo Chemical Co., LTD], the resin is maintained at 80° C. for 3 hours and cured. The curing of resin is an exothermic reaction, and thus thermal stress resides in the cured polymer composite due to different thermal expansion coefficients between the Laves phase and the polymer resin. The Laves phase, which has a lower thermal expansion coefficient, is subjected to compressive residual stress. The magnetostrictive strain of the polymer composite is increased proportionally to the compressive stress parallel to the direction of measurement. Thus, the residual thermal stress generated by the above process improves the magnetostrictive strain of the composite.

A better understanding of the present invention may be obtained in light of the following illustrative example, which should not be construed to limit the present invention.

EXAMPLE 1

Preparation of Polymer Composite using $Tb_{0.33}Dy_{0.67}Fe_{1.67}$

Figure 4:
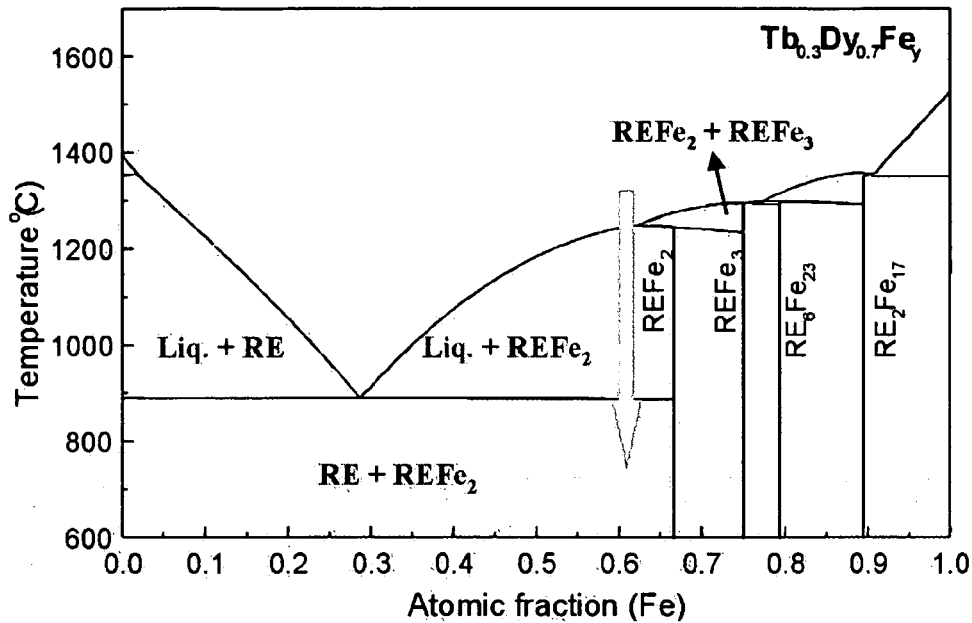
FIG. 4 is a pseudobinary phase diagram of $(Tb_{0.3}Dy_{0.7})$—Fe.

In this example, as a giant magnetostrictive material, an alloy including 90 vol % of primary $REFe_2$ phase and 10 vol % of eutectic phase was used. In FIG. 4, which shows a pseudobinary phase diagram of the alloy, terbium (Tb) and dysprosium (Dy) form a complete solid solution. The "RE" in the drawing refers to a rare earth phase of $Tb_xDy_{1-x}$, and $REFe_2$ is defined as a Laves phase having giant magnetostrictive property.

To prevent the alloy rod from being oxidized at a high temperature, a unidirectionally solidified material together with highly pure argon gas was loaded into a quartz tube filled with quartz granules having diameters of 1-4 mm (the contact surface area of the quartz granule and the unidirectionally solidified material varies with the size of the quartz granules), and the tube was sealed. The sealed sample was annealed at 1000° C., which was about 120° C. higher than the eutectic temperature, for 3 hours, to remove the liquid eutectic phase. A sample having fine open pores caused by removal of the liquid eutectic phase was infiltrated with YD-114 epoxy resin as follows. Epoxy resin was placed into a chamber (autoclave) capable of being subjected to evacuation and pressurization. The epoxy resin was heated up to 80° C. to decrease the viscosity of the epoxy resin. The chamber was evacuated to remove air present in the pores of the sample and gases present in the epoxy resin. After a few minutes the sample were separately charged into liquid epoxy of removed gases, followed by dipping the sample into liquid phase epoxy resin and curing it for 2 hours (a pressure of about 2 atm was applied to more easily perform infiltration).

Figure 5:
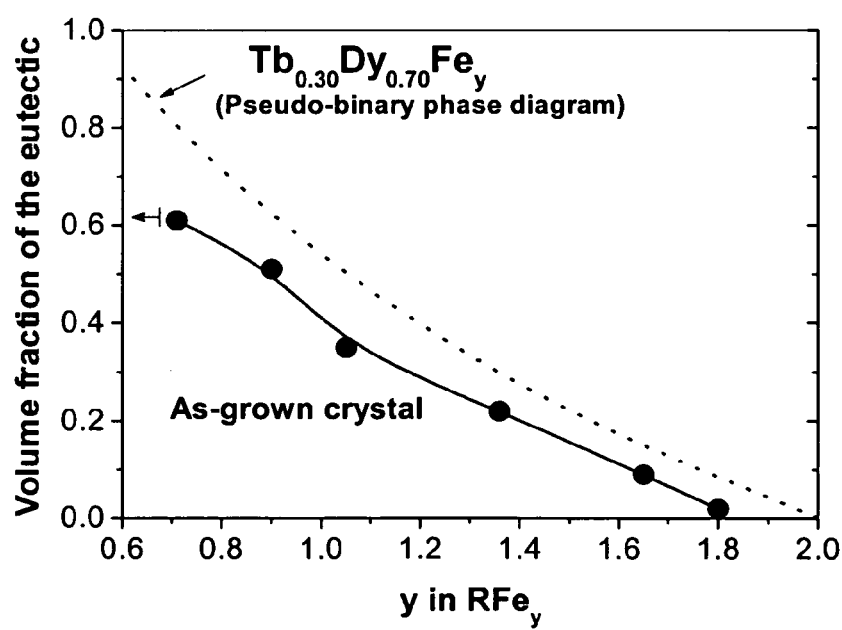
FIG. 5 is a graph showing the effect of Fe content and Tb/Dy ratio on a volume fraction of the eutectic phase of the unidirectionally solidified material and the polymer composite.

FIG. 5 shows the volume fraction of the eutectic phase varying with the Fe content (the y-axis value). To prepare the polymer-infiltrated composite, the Fe content and Tb/Dy ratio are altered, whereby the fraction of the eutectic phase may be controlled. Since the fraction of the eutectic phase acts as a factor determining the infiltration fraction at the polymer infiltration step, the change of the magnetostrictive strain can be controlled by the Fe content and Tb/Dy ratio.

Figure 6:
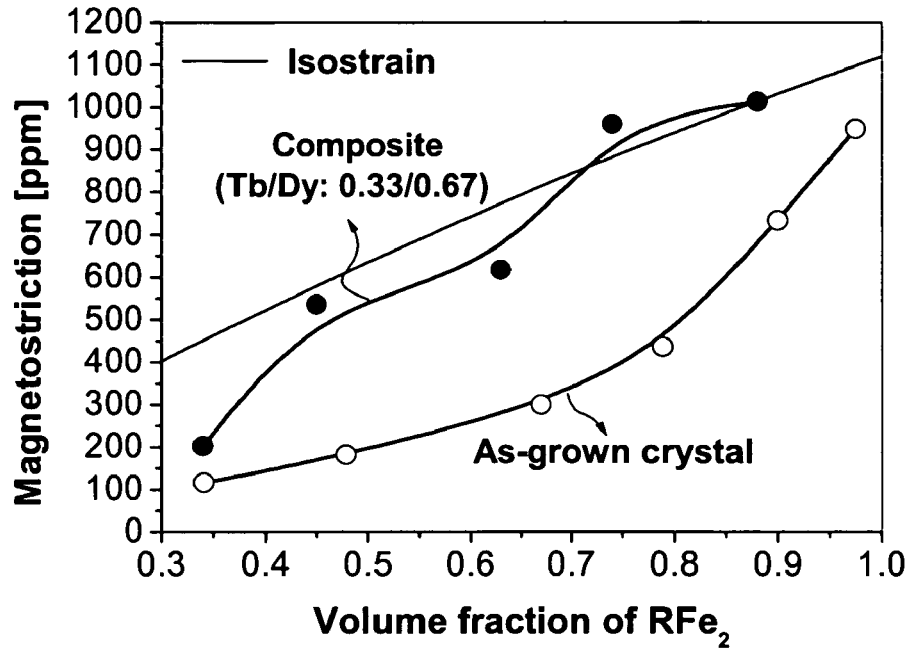
FIG. 6 is a graph showing the maximum magnetostrictive strain of the unidirectionally solidified material and the polymer composite prepared by the method of the present invention.

FIG. 6 compares the maximum magnetostrictive curves measured in the state where a compressive stress of 8 MPa is applied to the material. From this figure, it can be seen that the maximum magnetostrictive strain varies with the strength of the applied magnetic field. In the drawing, the dotted line corresponds to the maximum magnetostrictive strain of the unidirectionally solidified alloy and the full line to the maximum magnetostrictive strain of the polymer composite material, in which the composite has the maximum magnetostrictive strain about two times or more compared to the unidirectionally solidified material. The high magnetostrictive strain of the composite is achieved by removing the eutectic phase having diamagnetic properties from the unidirectionally solidified material and by effectively lowering the elastic modulus of the sample.

Figure 7:
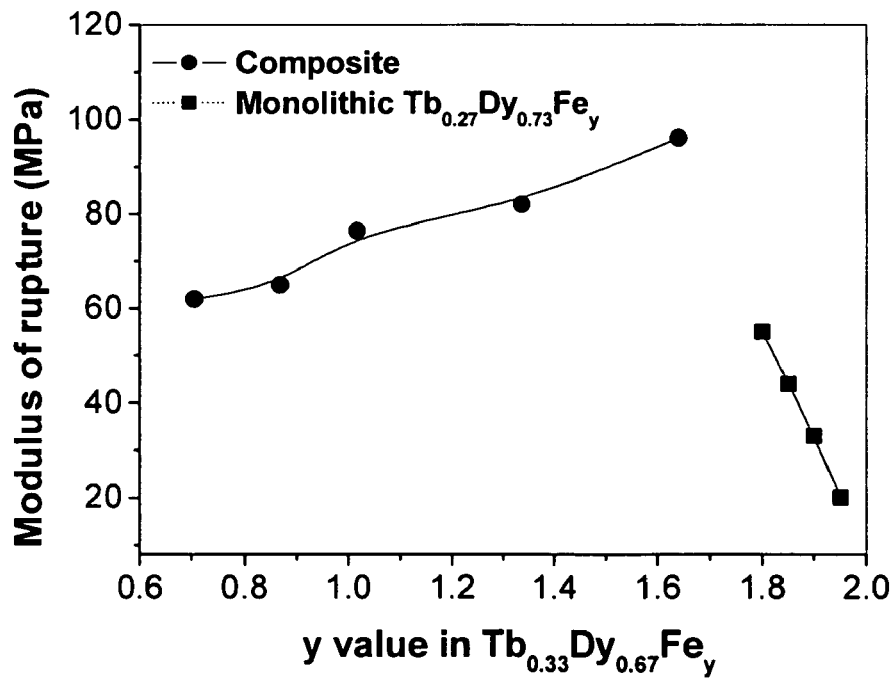
FIG. 7 is a graph showing the effect of an Fe content on rupture of modulus of the polymer composite prepared by the method of the present invention.

FIG. 7 shows the measurement results of rupture of modulus of the composite through a four-point flexural test. In this figure, the dotted line corresponds to the rupture of modulus of the unidirectionally solidified material having high Fe content. The rupture of modulus of the polymer-infiltrated composite gradually increases according to a decrease of the infiltration fraction of the polymer, and has the maximum rupture of modulus of 90 MPa.

The electric resistivities of the unidirectionally solidified alloy and the polymer composite are given in Table 1, below, in which the greater the amount of the epoxy resin substituted for the eutectic phase, the higher the resistivity.

TABLE 1

| | | Measured Electric Resistance | | |
|---|---|---|---|---|
| No. | State | $REFe_2$ Phase (vol %) | Number of measurements | Average Resistivity ($\mu\Omega m$) |
| 1 | Metal | 95 | 5 | 8.0 |
| 2 | Composite | 90 | 10 | 900 |
| 3 | Composite | 60 | 10 | 2500 |
| 4 | Composite | 40 | 12 | 20000 |

The electric resistance of the magnetostrictive material is increased due to the polymer resin serving as an insulator. Thus, eddy current loss can be decreased and toughness of the material can be improved, attributable to the polymer resin network formed in the material structure. Further, by using the polymer resin having lower Young's modulus than the rare earth metals, the magnetostrictive strain of the polymer composite described herein is higher than that of the magnetostrictive material containing the eutectic phase of the same volume fraction as the polymer resin. Furthermore, the preparation method involving the reaction annealing process can increase magnetic properties.

The present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Also, the order of method steps may be rearranged. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

What is claimed:

1. A method of preparing a polymer composite, the method comprising:
   (a) reaction annealing a unidirectionally solidified giant magnetostrictive material to remove a eutectic phase and create a rare earth metal phase with voids;
   (b) infiltrating a polymer resin into the voids; and
   (c) curing the polymer resin.

2. The method of claim 1, wherein the reaction annealing is performed at a temperature higher than the eutectic temperature using a reaction furnace and using oxides to remove a liquid rare earth phase from the magnetostrictive material.

3. The method of claim 1, wherein the reaction annealing is performed in a reaction furnace at a temperature higher than the eutectic temperature and using a reaction promoter to remove the liquid rare earth phase from the magnetostrictive material.

4. The method of claim 3, wherein the reaction promoter comprises quartz granules.

5. The method of claim 1, wherein the reaction annealing is performed at a higher temperature than a eutectic temperature.

6. The method of claim 1, wherein the giant magnetostrictive material comprises a rare earth-iron magnetostrictive alloy.

7. The method of claim 6, wherein the rare earth-iron magnetostrictive alloy is selected from the group consisting of:

$$Tb_xDy_{1-x}Fe_{2-w}\ (0.27 \leq x \leq 0.35,\ 0 \leq w \leq 1.30);$$

$$Tb_xHo_{1-x}Fe_{2-w}\ (0.10 \leq x \leq 1.00,\ 0 \leq w \leq 1.30);$$

$$Sm_xDy_{1-x}Fe_{2-w}\ (0.80 \leq x \leq 1.00,\ 0 \leq w \leq 1.30);$$

$$Sm_xHo_{1-x}Fe_{2-w}\ (0.60 \leq x \leq 1.00,\ 0 \leq w \leq 1.30);$$

$$Tb_xHo_yDy_zFe_{2-w}\ (0.10 \leq x \leq 1.00,\ 0 \leq y \leq 0.9,\ 0 \leq z \leq 0.8,\ 0 \leq w \leq 1.30,\ x+y+z=1);\ \text{and}$$

$$Sm_xHo_yDy_zFe_{2-w}\ (0.60 \leq x \leq 1.00,\ 0 \leq y \leq 0.4,\ 0 \leq z \leq 0.4,\ 0 \leq w \leq 1.30,\ x+y+z=1).$$

8. The method of claim 1, wherein the reaction annealing is performed at about 1000° C. for approximately 3 hours.

9. The method of claim 1, further comprising applying pressure to the polymer resin to prevent formation of pores in the polymer resin upon curing.

10. The method of claim 1, wherein the curing is performed by heating the polymer resin at about 80° C. for approximately 3 hours.

11. The method of claim 1, wherein the polymer resin is selected from the group consisting of epoxy resin, phenol resin, polyimide and polystyrene.

12. The method of claim 1, wherein the polymer composite includes a rare earth metal phase, and wherein the polymer resin has a lower Young's modulus than the rare earth metal phase.

13. The method of claim 1, wherein the unidirectionally solidified giant magnetostrictive material includes at least 5% by volume of eutectic phase by way of controlling Fe contents.

14. The method of claim 1, wherein the infiltrated resin is a YD-114 epoxy resin.

15. A polymer composite prepared by the method of claim 1.

16. A method of preparing a polymer composite, the method comprising:
   (a) annealing a unidirectionally solidified giant magnetostrictive material that includes any of $Tb_xDy_{1-x}Fe_{2-w}$ ($0.27 \leq x \leq 0.35$, $0 \leq w \leq 1.30$), $Tb_xHo_{1-x}Fe_{2-w}$ ($0.10 \leq x \leq 1.00$, $0 \leq w \leq 1.30$), $Sm_xDy_{1-x}Fe_{2-w}$ ($0.80 \leq x \leq 1.00$, $0 \leq w \leq 1.30$), $Sm_xHo_{1-x}Fe_{2-w}$ ($0.60 \leq x \leq 1.00$, $0 \leq w \leq 1.30$), $Tb_xHo_yDy_zFe_{2-w}$ ($0.10 \leq x \leq 1.00$, $0 \leq y \leq 0.9$, $0 \leq z \leq 0.8$, $0 \leq w \leq 1.30$, $x+y+z=1$), and $Sm_xHo_yDy_zFe_{2-w}$ ($0.60 \leq x \leq 1.00$, $0 \leq y \leq 0.4$, $0 \leq z \leq 0.4$, $0 \leq w \leq 1.30$, $x+y+z=1$) to remove a eutectic phase and create a rare earth metal phase with voids;
   (b) infiltrating a polymer resin into the voids; and
   (c) curing the polymer resin.

17. The method of claim 16, wherein the annealing is performed at a temperature higher than the eutectic temperature using a reaction furnace and using any of oxides and a reaction promoter, to remove a liquid rare earth phase from the magnetostrictive material.

18. A polymer composite prepared by the method of claim 17.

19. A polymer composite comprising:
   a dendrite phase of unidirectionally solidified giant magnetostrictive material; and
   a polymer resin in voids between the dendrites of the unidirectionally solidified giant magnetostrictive material.

20. The polymer composite of claim 19, wherein the giant magnetostrictive material comprises a rare earth-iron magnetostrictive alloy.

21. The polymer composite of claim 19, wherein the rare earth-iron magnetostrictive alloy is selected from the group consisting of:

$$Tb_xDy_{1-x}Fe_{2-w}\ (0.27 \leq x \leq 0.35,\ 0 \leq w \leq 1.30);$$

$$Tb_xHo_{1-x}Fe_{2-w}\ (0.10 \leq x \leq 1.00,\ 0 \leq w \leq 1.30);$$

$$Sm_xDy_{1-x}Fe_{2-w}\ (0.80 \leq x \leq 1.00,\ 0 \leq w \leq 1.30);$$

$$Sm_xHo_{1-x}Fe_{2-w}\ (0.60 \leq x \leq 1.00,\ 0 \leq w \leq 1.30);$$

$$Tb_xHo_yDy_zFe_{2-w}\ (0.10 \leq x \leq 1.00,\ 0 \leq y \leq 0.9,\ 0 \leq z \leq 0.8,\ 0 \leq w \leq 1.30,\ x+y+z=1);\ \text{and}$$

$$Sm_xHo_yDy_zFe_{2-w}\ (0.60 \leq x \leq 1.00,\ 0 \leq y \leq 0.4,\ 0 \leq z \leq 0.4,\ 0 \leq w \leq 1.30,\ x+y+z=1).$$

22. The polymer composite of claim 19, wherein the polymer resin is selected from the group consisting of epoxy resin, phenol resin, polyimide and polystyrene.

23. The polymer composite of claim 19, wherein the polymer composite includes a rare earth metal phase, and wherein the polymer resin has a lower Young's modulus than the rare earth metal phase.

24. The polymer composite of claim 19, wherein the unidirectionally solidified giant magnetostrictive material includes at least 5% by volume of eutectic phase by way of controlling Fe contents.

* * * * *